United States Patent

Kotooka et al.

[11] Patent Number: 6,036,776
[45] Date of Patent: Mar. 14, 2000

[54] METHOD AND DEVICE FOR MANUFACTURING SINGLE CRYSTALS

[75] Inventors: Toshiro Kotooka; Yoshiyuki Shimanuki; Makoto Kamogawa, all of Hiratsuka, Japan

[73] Assignee: Komatsu Electronic Metals Co., Ltd., Hiratsuka, Japan

[21] Appl. No.: 09/145,083

[22] Filed: Sep. 1, 1998

[30] Foreign Application Priority Data

Sep. 22, 1997 [JP] Japan ................................. 9-275097

[51] Int. Cl.[7] ................................................ G30B 35/00
[52] U.S. Cl. ........................ 117/217; 117/218; 117/219; 117/222
[58] Field of Search ................................ 117/217, 218, 117/219, 222

[56] References Cited

U.S. PATENT DOCUMENTS

| 4,597,949 | 7/1986 | Jasinski et al. | 117/217 |
| 4,973,454 | 11/1990 | Morioka et al. | 117/213 |
| 5,248,378 | 9/1993 | Oda et al. | 117/217 |
| 5,268,061 | 12/1993 | Sunwoo et al. | 117/23 |
| 5,567,399 | 10/1996 | Von Ammon et al. | 422/245.1 |
| 5,853,480 | 12/1998 | Kubota et al. | 117/217 |

FOREIGN PATENT DOCUMENTS

| 0297478 | 4/1990 | Japan . |
| 0297479 | 4/1990 | Japan . |
| 8239391 | 8/1996 | Japan . |

*Primary Examiner*—Felisa Hiteshew
*Attorney, Agent, or Firm*—Abelman, Frayne & Schwab

[57] ABSTRACT

This invention provides a single-crystal manufacturing device which can perform the lifting of single crystals at a high speed, allowing single crystals with uniform qualities along their axes can be obtained.

The method for manufacturing single crystals according to this invention are achieved by using a single-crystal manufacturing device provided with a combination of a heat shield plate 1 and an after-cooler 21. The heat shield plate 1, the thickness of the lower portion of which is 2–6 times that of a conventional heat shield plate, surrounds the single crystal 7 being lifted. The after-cooler 21 covers the top surface of the rim 1a of the heat shield plate 1 and encompasses the single crystal 7 being lifted. The amount of cooling water supplied to the after-cooler 21 is slowly increased until the time the single crystal is lifted to a preset length, and then the amount of cooling water is kept constant. By this means, the temperature gradients of the single crystal in the region near the solid-liquid boundary can be increased, and the shape of the single crystal lifted can be easily kept unchanged. Furthermore, the lifting speed of the single crystal is kept constant from the top to the bottom of the crystal. Compared with conventional methods, the single-crystal lifting speed can be multiplied by a value of 1.3–2.2. Therefore, single crystals with uniform qualities along their axes can be obtained.

4 Claims, 8 Drawing Sheets

METHOD AND DEVICE FOR MANUFACTURING SINGLE CRYSTALS

BACKGROUND OF THE INVENTION

1. Field of the Invention

The present invention relates to a method and a device for manufacturing single crystals by employing the Czochralski Method (CZ method).

2. Description of Prior Art

Substrates of semiconductor components are made of high-purity single-crystal silicon. Production of the substrates of semiconductor components is ordinarily performed by the CZ method. In the single-crystal manufacturing device (see FIG. 8) employing the CZ method, a crucible 8 capable of ascending or descending freely is installed at the central portion of the chamber 2. The crucible 8 consists of a graphite crucible 8a and a quartz crucible 8b accommodated within the graphite crucible 8a. Polycrystalline silicon in lumps is deposited into the quartz crucible 8b, then the polycrystalline silicon is heated to melt into melted liquid 3 via a heater 5 disposed around the crucible 8. Subsequently, a seed crystal installed within a seed holder 9 is dipped into the melted liquid 3. Afterward, the seed holder 9 and the quartz crucible 8 are respectively driven to rotate in the same or opposite directions. At the same time, the seed holder 9 is lifted to grow a single crystal 7 with predetermined diameter and length.

A heat-shield plate 10 is installed above the melted liquid 3. The heat-shield plate 10 comprises a rim 10a, which is in the shape of a ring and covers the hot zone, and an adiabatic cylinder 10b connected to the inner edge of the heat-shield plate 10. The adiabatic cylinder 10b is in the shape of an upside-down cone which surrounds the single crystal 7 being lifted, and an adiabatic material 6 made of carbon fibers is accommodated therewithin. Furthermore, an adiabatic material 4 is installed on the outer edge of the rim 10a. The heat-shield plate 10 is used for shielding the single crystal 7 from heat radiating from the surface of the melted liquid 3 or the heater 5. The lifting speed of the single crystal 7 can be raised by expediting the cooling of the single crystal 7, which can be achieved by amplifying the temperature gradients in the longitudinal and the radial directions, especially in the region near the solid-liquid boundary. Furthermore, the heat-shield plate 10 plays the role of guiding the inert gas coming from above the chamber 2 into the surroundings of the single crystal 7 and expelling gases hindering single-crystallization, such as SiO, $SiO_2$, Si, or metal vapors coming from the crucible 8. This can improve the dislocation-free feasibility.

In addition to the above-described, a single-crystal manufacturing apparatus provided with a cylindrical heat-shield plate extending from the top plate of the chamber to the site near the melted liquid is also employed. The heat-shield plate controls the flow of the inert gas coming from above the chamber and shields the heat radiating from, for example, the melted liquid. By this arrangement, the temperature gradients in the region near the solid-liquid boundary can be increased during the lifting operation of the single crystal, and cooling or temperature maintenance in other temperature regions can be attained. Consequently, single-crystallization can be easily performed and single-crystal productivity is elevated (see for example, Japanese Patent Publication No. 02-97478 and 02-97479). On the other hand, in the single-crystal manufacturing apparatus disclosed in Japanese Patent Publication No. 8-239291, amplifying the temperature gradients in the single crystal requires that the lifting speed of the single crystal be raised. Installing a cooling pipe surrounding the single crystal being lifted and forcing coolant liquid to flow therethrough can amplify the temperature gradients.

However, the capability of conventional heat shield plates to shield heat radiating from the heater and the melted liquid is inefficient, therefore it suffers the following problems.

(1) It is impossible to shield heat radiating from the heater and the melted liquid with conventional heat shield plates so as to comply with the temperature gradient variation, which is induced by the length change of the single crystal being lifted, along the longitudinal axis of the single crystal. Therefore, the lifting speed of the single crystals gets slower from the top to the bottom of the crystal, and the productivity of the single crystals is thus reduced.

(2) The heat history of the temperature zones located at different sites of the single crystal will change if the lifting speed alters. Therefore, grown-in defects, and the amount of oxygen precipitation are affected, and the quality along the longitudinal axis of the single crystal can not be made even.

(3) The cooling area of the cooling pipe installed in the single-crystal manufacturing apparatus disclosed in Japanese Patent Publication No. 8-239291 is small, therefore a sufficient cooling effect can not be obtained.

(4) In the single-crystal manufacturing apparatus in which heat shield plates are affixed, the crucible is unable to be raised during the process of melting raw material. Accordingly, the material lying on the bottom of the crucible can not be melted in an efficient way.

SUMMARY OF THE INVENTION

In view of the above disadvantages, the object of the present invention is to provide a method and a device for manufacturing single crystals, by which the temperature gradients in the region near the solid-liquid boundary can be increased and lifting of single crystals can be performed at a speed higher than by conventional means. Furthermore, the lifting speed of the single crystals can be kept constant from the top to the bottom of the crystal, and the heat history throughout the entire single crystal can be kept uniform. Thus, the quality along the longitudinal axis of a grown single crystal can be kept uniform.

To achieve the above object, the first aspect of the single-crystal manufacturing device employing the CZ method of this invention is characterized in that it is provided with a heat shield plate consisting of a ring-shaped rim installed above the hot zone and an adiabatic cylinder extending downward from the inner edge of the rim and surrounding the single crystal being lifted, the thickness of the lower portion being 2–6 times that of a conventional heat shield plate, the top portion of the heater being located below the connection line connecting the lower end of the heat shield plate and the intersection of the outer periphery of the single crystal being lifted and the free surface of the melted liquid.

According to the first aspect of the single-crystal manufacturing device of this invention, the temperature gradient during the lifting operation can be controlled by a simple structure in which a heat shield plate having different thickness along its longitudinal axis is provided. The most important factor affecting the high-speed lifting of single crystals is the temperature gradient along the longitudinal axis of the single crystal in the region near the solid-liquid boundary. The temperature gradient along the longitudinal axis of the single crystal is in a positive correlation with the lifting speed. That is, increase in the temperature gradient along the longitudinal axis of the single crystal allows increase in the lifting speed. However, if the lifting speed of the single crystal is increased by an excessive amount with respect to the temperature gradient, then single-crystal distortion and hunting will occur and lead to insufficient diameter or surface defects. (Insufficient diameter defect is the phenomenon in which the diameter of the single crystal lifted is smaller than the expected value due to crystal distortion and hunting. A single crystal with an insufficient diameter defect is regarded as failed because its diameter is insufficient for polishing.) According to the above structure, the thickness of the lower portion of the heat shield plate is made to be 2–6 times that of a conventional heat shield plate; therefore, adiabatic endurance to radiated heat is enhanced. The single crystal being lifted is thus cooled down rapidly, and the temperature gradient in the region near the solid-liquid boundary is enlarged. This will keep the shape of the single crystal invariant.

By this arrangement, difficulties in the lifting operation can be moderated and the lifting speed of the single crystals can be kept constant through the entire length.

It is known that the temperature gradient along the longitudinal axis of the single crystal in the region near the solid-liquid boundary is greatly affected by the heat radiating from the melted liquid and the heater. Thus, the temperature gradient can be enlarged to raise the lifting speed of the single crystals if the heat radiating from the melted liquid and the heater is shielded to the greatest extent possible. The intention of this invention is to block the radiated heat. As shown in FIG. 1, the top end of the heater is located below the connection line connecting the lower end of the heat shield plate and the intersection of the outer periphery of the single crystal being lifted and the free surface of the melted liquid. Therefore, heat radiating from the heater can be kept to a minimum value.

The second aspect of the single-crystal manufacturing device of this invention is characterized in that: in modification to the first aspect of the single-crystal manufacturing device of this invention, an after-cooler covering the top surface of the rim of the heat shield plate and being disposed inside the adiabatic cylinder is provided to encompass the single crystal being lifted.

By installing the after-cooler, the space above the chamber and the single crystal being lifted can be effectively cooled down. Hence, the temperature gradient along the longitudinal axis of the single crystal can be kept constant even if the length of the single crystal is increased.

The third aspect of the single-crystal manufacturing device of this invention is characterized in that: in modification to the second aspect of the single-crystal manufacturing device of this invention, the heater extends downward for a distance equal to the raised span of the crucible while melting the raw material and its heating center is shifted a distance equal to the raised span of the crucible while melting the raw material, or the heater extends downward for a distance equal to the raised span of the crucible while melting the raw material and is divided into two stages.

In the single-crystal manufacturing devices shown in FIGS. 2, 5 and 7, the after-coolers are immovable. Therefore, the heat shield plates are unable to be shifted upward or downward. Hence, it is difficult to first heat and melt in the first place the raw material located at the bottom of the crucible when the crucible has been raised at the beginning of melting the raw material. Conventional heaters first melt the upper portion of the raw material, and this brings about a non-melted remainder or liquid spattering, which will remarkably reduce the single-crystallization rate. The above problems can be solved by extending the heater downward for a distance equal to the raised span of the crucible while melting the raw material and shifting its heating center a distance equal to the raised span of the crucible while melting the raw material (see FIG. 2), or by extending the heater downward for a distance equal to the raised span of the crucible while melting the raw material and dividing it into two stages.

The fourth aspect of the single-crystal manufacturing device of this invention is characterized in that: in modification to the first aspect of the single-crystal manufacturing device of this invention, the after-cooler surrounding the single crystal being lifted is installed in a manner that it can ascend and descend without any restraint.

Due to the fact that the after-cooler is installed in such a manner that it can ascend and descend without any restraint, the after-cooler can be raised together with the heat shield plate to the upper portion of the chamber while melting the raw material. Thus, melting of the raw material can be performed by raising the crucible to a normal height and employing a heater having an ordinary length.

The fifth aspect of the single-crystal manufacturing device of this invention is characterized in that: in modification to the third aspect of the single-crystal manufacturing device of this invention, an after-heater surrounding the single crystal being lifted is installed in a manner that it can ascend and descend without any restraint.

The after-heater can optionally cover any portion of the single crystal being lifted to hinder heat dissipation therefrom; therefore the single crystal can be cooled down slowly. Furthermore, reducing the temperature gradient within the range between 600° C. to 700° C. in the single crystal can control the amount of oxygen precipitation. In addition, if the after-heater is raised together with the heat shield plate to the upper portion of the chamber while melting the raw material, melting of the raw material can be performed by raising the crucible to a normal height and employing a heater having an ordinary length.

The first aspect of the method for manufacturing single crystals according to this invention is characterized in that: in the process of manufacturing single crystals by a single-crystal manufacturing device provided with an after-cooler, the amount of cooling water supplied to the after-cooler is at least slowly increased, at a predetermined rate, until the time the single crystal is lifted to a preset length.

When the single crystal being lifted is still short, the temperature gradient along the longitudinal axis of the single crystal is extremely large and this allows raising of the lifting speed. However, the temperature gradient is reduced following the increase of the length of the single crystal, therefore the lifting speed decreases from the top to the bottom of the single crystal.

In this invention, the amount of cooling water supplied to the after-cooler is increased in response to the grown length of the single crystal. Therefore, the above problem can be solved.

The second aspect of the method for manufacturing single crystals according to this invention is characterized in that: in the process of manufacturing single crystals by a single-crystal manufacturing device provided with a heater divided into an upper-stage heater and a lower-stage heater, the output of the upper-stage heater is kept at a value 20–50% of the output of the lower-stage heater during the melting of the raw material, and lifting of the single crystal is performed by controlling the output of the upper-stage heater in such a way that the output of the lower-stage heater is kept at a value 20–50% of the output of the upper-stage heater during lifting the single crystal.

In the event that the heater is divided into two stages (see FIGS. 5 and 7), during the melting of the raw material the power of the lower-stage heater is primary used so as to firstly melt the raw material located at the bottom of the crucible. Furthermore, after melting the raw material, the output proportion between the upper-stage heater and the lower-stage heater is inverted. Accordingly, the temperature of the melted liquid is controlled in a normal way during the lifting of the single crystal.

The third aspect of the method for manufacturing single crystals according to this invention is characterized in that: in the process of manufacturing single crystals by a single-crystal manufacturing device provided with an after-heater capable of ascending or descending without any restraint, the single crystal being lifted and at a temperature ranging from 600° C. to 700° C. is cooled down slowly with the aid of the after-heater.

The temperature gradient of the single crystal being lifted experiences extreme fluctuations in response to the amount of cooling water and the location of the after-cooler. The temperature gradient of the single crystal at a temperature ranging from 600° C. to 700° C. increases if the lower end of the after-cooler moves away from the free surface of the melted liquid. On the contrary, if the lower end of the after-cooler approaches the free surface of the melted liquid, the above temperature gradient may decline to a value lower than that in a conventional hot zone. If a heat shield plate and an after-cooler is used in combination with the after-heater, the temperature gradient of the single crystal is greatly enlarged. The temperature gradient of the single crystal varies from 0.8–1.6 times that of the conventional single-crystal manufacturing device shown in FIG. 8. When the temperature gradient of the single crystal at a temperature ranging from 600° C. to 700° C. is large, the temperature gradient can be reduced by installing an after-heater above the after-cooler and heating the single crystal. Accordingly, the amount of oxygen precipitation in the single crystal can also be restrained.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Figure 1:
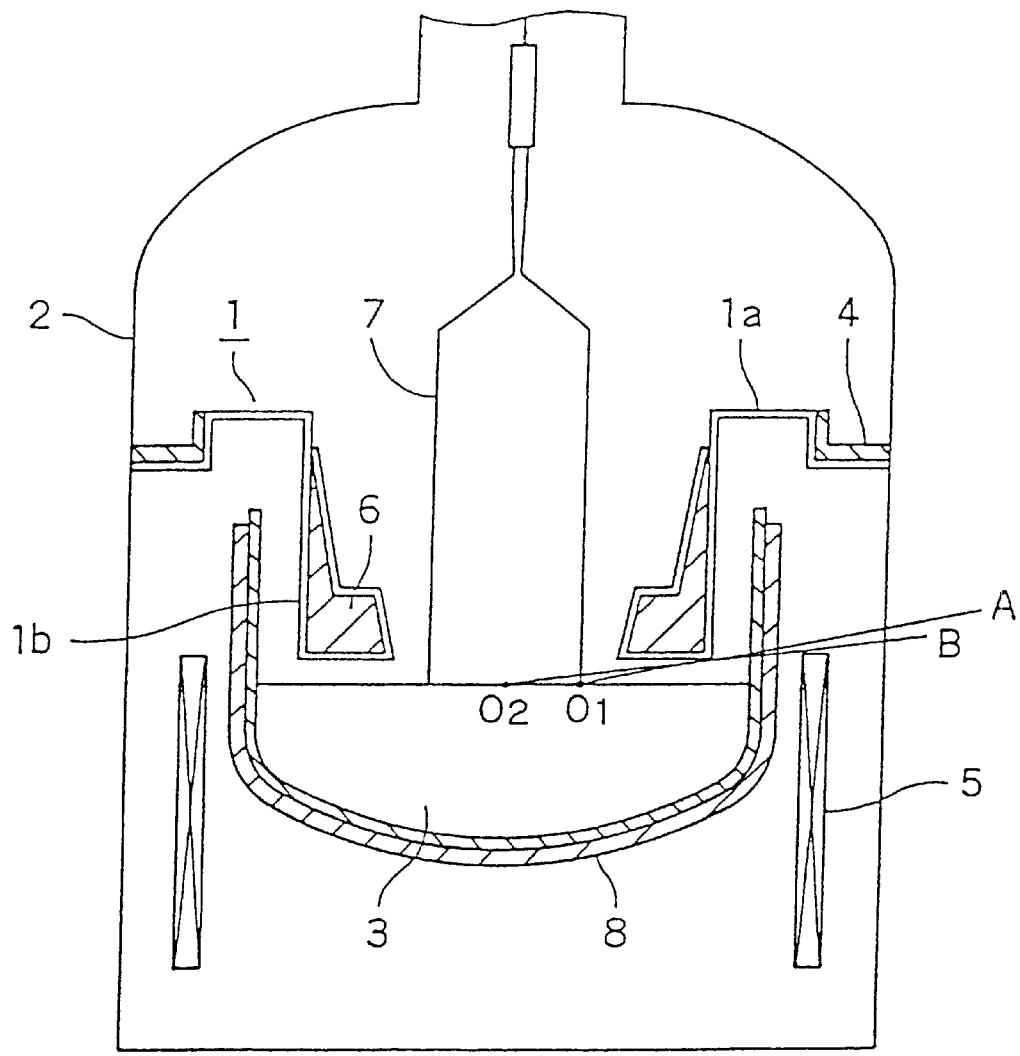
FIG. 1 is a schematic diagram showing the lower portion of the single-crystal manufacturing device according to the first embodiment of this invention.

The method and the device for manufacturing single crystals according to this invention can be more fully understood by reading the subsequent detailed description and embodiments with references made to the accompanying drawings. FIG. 1 is a schematic diagram showing the lower portion of the single-crystal manufacturing device according to the first embodiment of this invention. As shown in FIG. 1, a heat shield plate 1 consists of a ring-shaped rim 1a covering the hot zone and an adiabatic cylinder 1b extending downward from the inner edge of the rim 1a. The heat shield plate 1 is suspended over the melted liquid 3 via wires from an ascending/descending mechanism (not shown) installed outside the chamber 2. The heat shield plate 1 is made of graphite or heat-endurance metal, and an adiabatic material 4 made of carbon fiber is installed on the top surface of the rim 1a. Furthermore, the outer shape of the adiabatic cylinder 1b is a cylinder. A tapered hole, whose lower opening is smaller than the upper opening, is formed in the adiabatic cylinder 1b. The tapered hole is provided with a horizontal-stepped portion. To shield the heat radiating from the melted liquid and the heater 5, the thickness of the lower end of the adiabatic cylinder 1b is set to be a value 2–6 times that of a conventional adiabatic cylinder (see FIG. 8). The inner space of the adiabatic cylinder 1b is filled with an adiabatic material made of carbon fibers. If the diameter of the lower opening is reduced to the lowest value not disturbing the flow of inert gas, the temperature gradient along the longitudinal axis of the single crystal will be further enlarged.

The top portion of the heater 5 is located below the connection line A connecting the lower end of the heat shield plate 1 and the intersection $O_1$ of the outer periphery of the single crystal 7 being lifted and the free surface of the melted liquid 3, and preferably below the connection line B connecting the lower end of the heat shield plate 1 and the intersection $O_2$ of the central line of the single crystal 7 being lifted and the free surface of the melted liquid 3.

The following is an explanation of the method for manufacturing single crystals employing the single-crystal manufacturing device according to the first embodiment of this invention. In the step of melting the raw material fed into the crucible 8, the heat shield plate 1 is elevated to the upper portion of the chamber 2 to avoid interference between the raw material and the heat shield plate 1. The upper end of the crucible 8 is raised to a location higher than the upper end of the heater 5 by a distance of about 20–50 mm so as to melt the raw material located at the bottom of the crucible 8. After the raw material has been melted, the heat shield plate 1 descends and is held at a location where the lower end of the heat shield plate 1 keeps a preset distance apart from the free surface of the melted liquid 3. To shield the single crystal 7 from the heat radiating from the melted liquid 3, the gap between the lower end of the heat shield plate 1 and the free surface of the melted liquid 3 is preferably extremely small. However, to avoid disturbing the flow of inert gas, which will impose a harmful affect on single-crystallization rate, a gap of at least 10-mm is necessary. Then, a seed crystal is dipped into the melted liquid 3. Subsequently, dislocation of the seed crystal, which is induced by heat impact, is released to the outer surface of the reduced portion by the dash method. Next, the diameter of the single crystal being lifted is gradually enlarged to form a shoulder, and operation is shifted to body-forming process.

Figure 2:
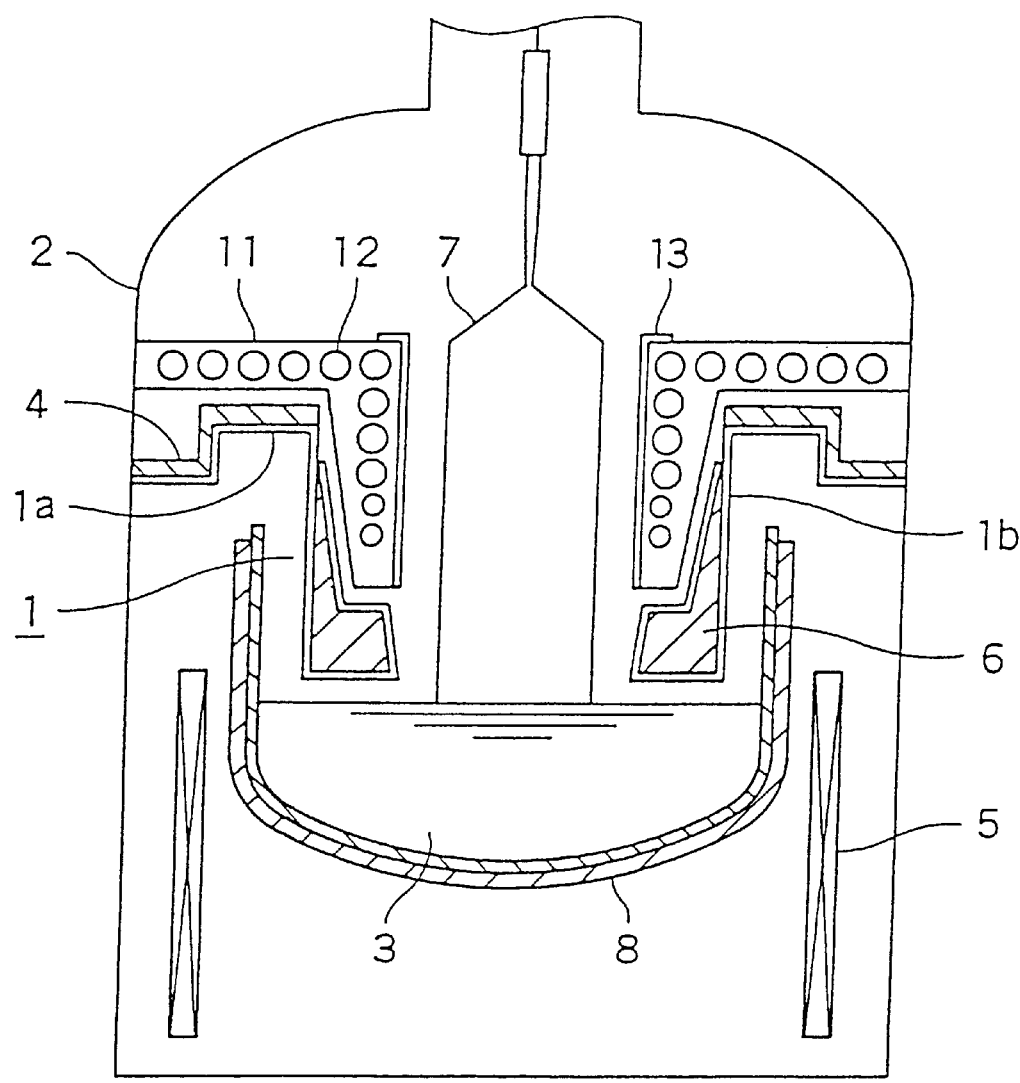
FIG. 2 is a schematic diagram showing the lower portion of the single-crystal manufacturing device according to the second embodiment of this invention.

FIG. 2 is a schematic diagram showing the lower portion of the single-crystal manufacturing device according to the second embodiment of this invention. The single-crystal manufacturing device is that of the first embodiment with an after-cooler additionally installed therein. The after-cooler 11 covers the top surface and about half of the inner surface of the heat shield plate 1. The after-cooler 11 is a box made of heat endurance metal with cooling water piping 12 accommodated therein. A heat-absorption sheet 13 is affixed on the cylindrical inner surface of the after-cooler 11. The inner surface surrounds the single crystal 7. The heat-absorption sheet 13 is made of thin SUS material whose surface is treated by chemical solution to turn it black so as to increase its radiation absorption rate. The heat-absorption sheet 13 also plays the role of protecting the after-cooler from liquid spattering occurred in the process of melting the raw material. The heat-absorption sheet 13 is a nonessential component, however it can enhance the cooling efficiency.

Since the after-cooler 11 is affixed within the chamber 2, the heat shield plate 1 is unable to be raised. In order to eliminate the interference between the raw material and the heat shield plate 1 during the melting of the raw material, it is necessary to lower the crucible 8 and to perform the melting of the raw material at a location lower than in conventional methods. In the single-crystal manufacturing device according to this embodiment, the axial length of the heater 5 is longer than that of conventional devices by 30–100 mm so as to facilitate melting of the raw material, and accordingly its heating center is shifted downward the same distance.

The after-cooler 11 surrounds the single crystal 7 except for the central portion of the chamber through which the single crystal 7 passes; therefore, not only the single crystal 7 but also the space above the hot zone is moderately cooled down. Hence, gases such as SiO, $Sio_2$, or Si evaporating from the melted liquid 3 are inclined to adhere on the bottom surface of the rim 1a of the heat shield plate 1. If such substances drop down on the melted liquid 3 and stick on the single crystal 7 being lifted, they will become a hindrance to single-crystal growth. Accordingly, an adiabatic material 4 made of carbon fibers is installed on and throughout the top surface of the rim 1a located below the after-cooler 11 to prevent cooling down of the bottom surface of the rim 1a.

Figure 3:
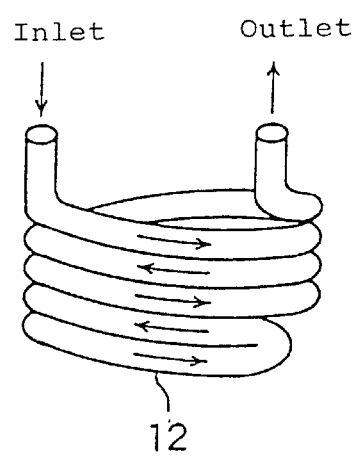
FIG. 3a is a perspective view showing the piping of cooling water in the after-cooler according to the first embodiment of this invention.
FIG. 3b is a perspective view showing the piping of cooling water in the after-cooler according to the second embodiment of this invention.
FIG. 3c is a perspective view showing the piping of cooling water in the after-cooler according to the third embodiment of this invention.
FIG. 3d is a perspective view showing the piping of cooling water in the after-cooler according to a conventional example.
Figure 3:
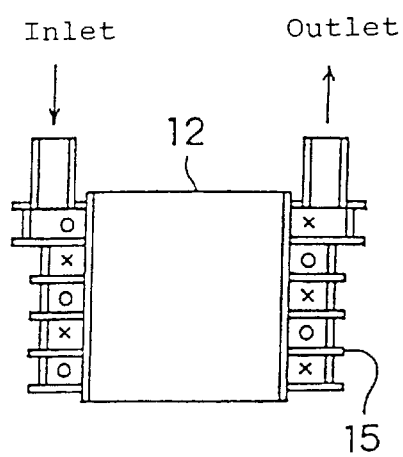
Figure 3:
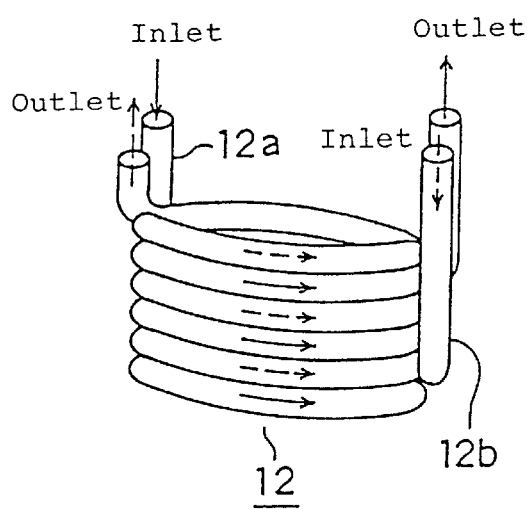
Figure 3:
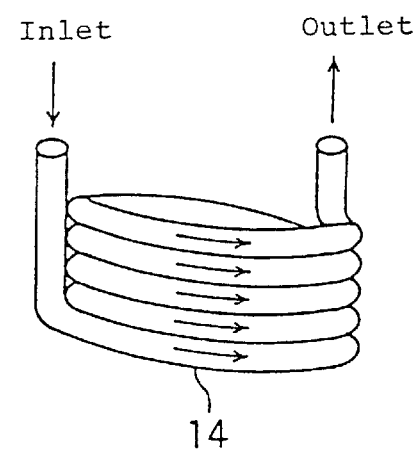

FIG. 3a is a perspective view showing the piping of cooling water in the after-cooler according to the first embodiment. FIG. 3b is a perspective view showing the piping of cooling water in the after-cooler according to the second embodiment. FIG. 3c is a perspective view showing the piping of cooling water in the after-cooler according to the third embodiment. Furthermore, FIG. 3d is a perspective view showing the piping of cooling water in a conventional after-cooler. Further what is shown in the above figures, each piping of cooling water in the after-cooler is connected to a piping wrapped in a coil-shape and located thereabove. The description of the latter is omitted.

In the conventional coil-shaped cooling piping 14 shown in FIG. 3d, cooling water enters the piping 14 from the inlet and flows out of the outlet via a path ascending from the bottom in the arrow direction. In the piping having such a structure, the temperature gradient within the hot zone in a radial direction is different on the same horizontal plane; this will bring about abnormal growth during single-crystal lifting. In contrast to the above, the piping 12 shown in FIG. 3a is formed by wrapping a pipe folded in an overlap manner into a coil, with cooling water flowing in the arrow direction of FIG. 3a. FIG. 3b is a crossed section showing an after-cooler having a jacket-type piping 12 in which cooling water flows between partition plates 15 in the direction shown in FIG. 3a. In other words, cooling water entering from the inlet flows downward along the path marked by the symbol "o" to the bottom in a consecutive way, then flows upward and out of the outlet along the path marked by the symbol "x". In addition, the piping 12 shown in FIG. 3c is formed by wrapping two pipes 12a and 12b into a coil, two inlets and two outlets are respectively provided therein. Cooling water supplied to the pipe 12a flows along the path shown by solid arrows, and cooling water supplied to the pipe 12b flows along the path shown by dotted arrows. In the structures shown in FIGS. 3a, 3b and 3c, cooling water flows along paths symmetric to the axis of the single crystal being lifted. Hence, within the hot zone, the temperature gradient in the axial direction of the single crystal being lifted can be kept steady in each single plane. Furthermore, instead of the piping shown in FIG. 3c, it is also acceptable to wrap three pipes into a coil and to keep three inlets and three outlets spaced apart from one another at a 120° pitch. Namely, the three inlet pipes are extended with respect to the cylinder from the top to the bottom at a 120° pitch and along a path turn in the clockwise or the counterclockwise direction (only if the three rotate in the same way) with respect to the cylinder, and the three outlet pipes ascend from the bottom toward the top after the three inlet pipes have extended around the bottom for one turn or two turns.

Figure 4:
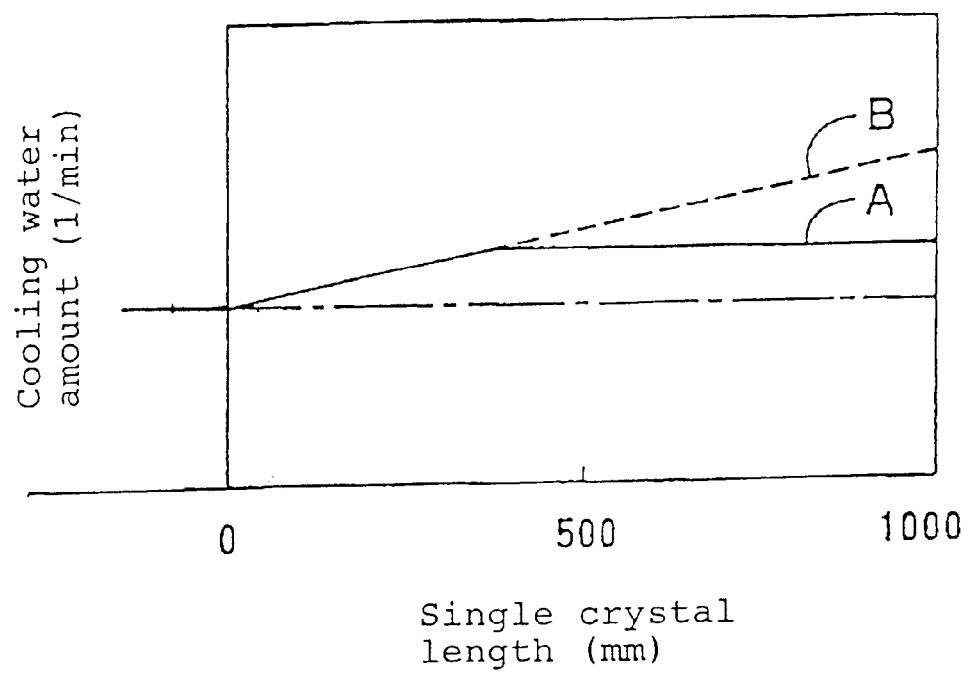
FIG. 4 is a graph showing the relationship between the amount of cooling water and the length of the single crystal.

In the event of employing the above second single-crystal manufacturing device, the flow rate of the after-cooler is controlled as the following. The amount of cooling water supplied to the piping 12 is kept constant until the end of shoulder forming process. After having shifted to the body forming process, the amount of cooling water is gradually increased (as shown by solid line of FIG. 4) until the single-crystal length reaches a preset value. According to the result of measuring the single-crystal temperature, the temperature gradient remains unvaried after the single-crystal length has reached a certain value. In this embodiment, the amount of cooling water is gradually increased until the single-crystal length reaches 300–400 mm. Then, the amount of cooling water is kept unchanged (indicated by A of FIG. 4). Alternatively, it is also satisfactory to continue increasing the amount of cooling water (indicated by the dotted line B of FIG. 4). In the conventional method, the amount of cooling water is kept unchanged (indicated by the chain line of FIG. 4).

Figure 5:
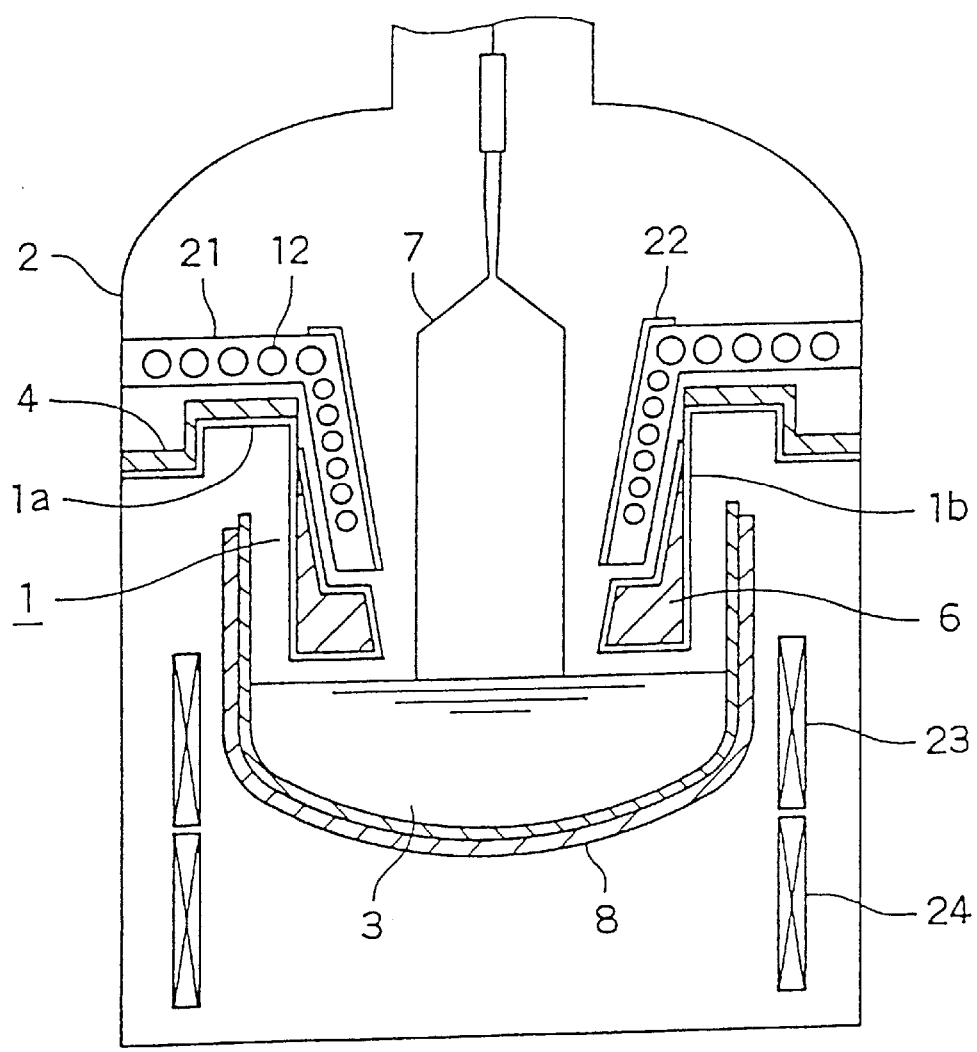
FIG. 5 is a schematic diagram showing the lower portion of the single-crystal manufacturing device according to the third embodiment of this invention.

FIG. 5 is a schematic diagram showing the lower portion of the single-crystal manufacturing device according to the third embodiment. In the above single-crystal manufacturing device, a heat shield plate 1 having the same structure as that of the heat shield plate shown in FIG. 1 is provided. An after-cooler 21 is installed over the heat shield plate 1. In the after-cooler 21, the portion surrounding the single crystal 7 is in the shape of a reversed cone, whose upper opening is larger than the lower opening. This enables an optical-type diameter control device to detect a meniscus phenomenon, which occurs at the solid-liquid boundary, easily. The reversed cone connects to the ring-shaped portion, which covers the rim 1a, namely, the top surface of the heat shield plate 1. Furthermore, a heat-absorption sheet 22 is affixed on the inner surface of the reversed cone. The inner structure of the after-cooler 21 can be any one of those shown in FIGS. 3a–3c. As the second embodiment of the single-crystal manufacturing device shown in FIG. 2, an adiabatic material 4 made of carbon fibers is installed on the top surface of the rim 1a. The heater is divided into two stages, namely, an upper-stage heater 23 and a lower-stage heater 24.

In the third embodiment of the single-crystal manufacturing device shown in FIG. 5, the after-cooler 21 is also affixed and unable to be shifted upward or downward. Therefore, it is necessary to lower the crucible 8 to avoid the interference between the raw material and the heat shield plate 1. In the single-crystal manufacturing device of this embodiment, the lower-stage heater 24 dominantly melts the raw material. The output of the upper-stage heater 23 is controlled at a value 20%–50% of that of the lower-stage heater 24. The raw material fed into the lowered crucible 8 is progressively melted from the bottom of the crucible 8. After melting the raw material, the surface temperature of the melted liquid 3 is kept constant and the location of the crucible 8 is adjusted to bring the free surface of the melted liquid 3 to a preset level. At this time, the output of the lower-stage heater 24 is adjusted at a value 20%–50% of that of the upper-stage heater 23. Furthermore, during the lifting of the single crystal, the output of the lower-stage heater 24 is kept constant and control of the single-crystal growth is achieved by the output of the upper-stage heater 23.

Figure 6:
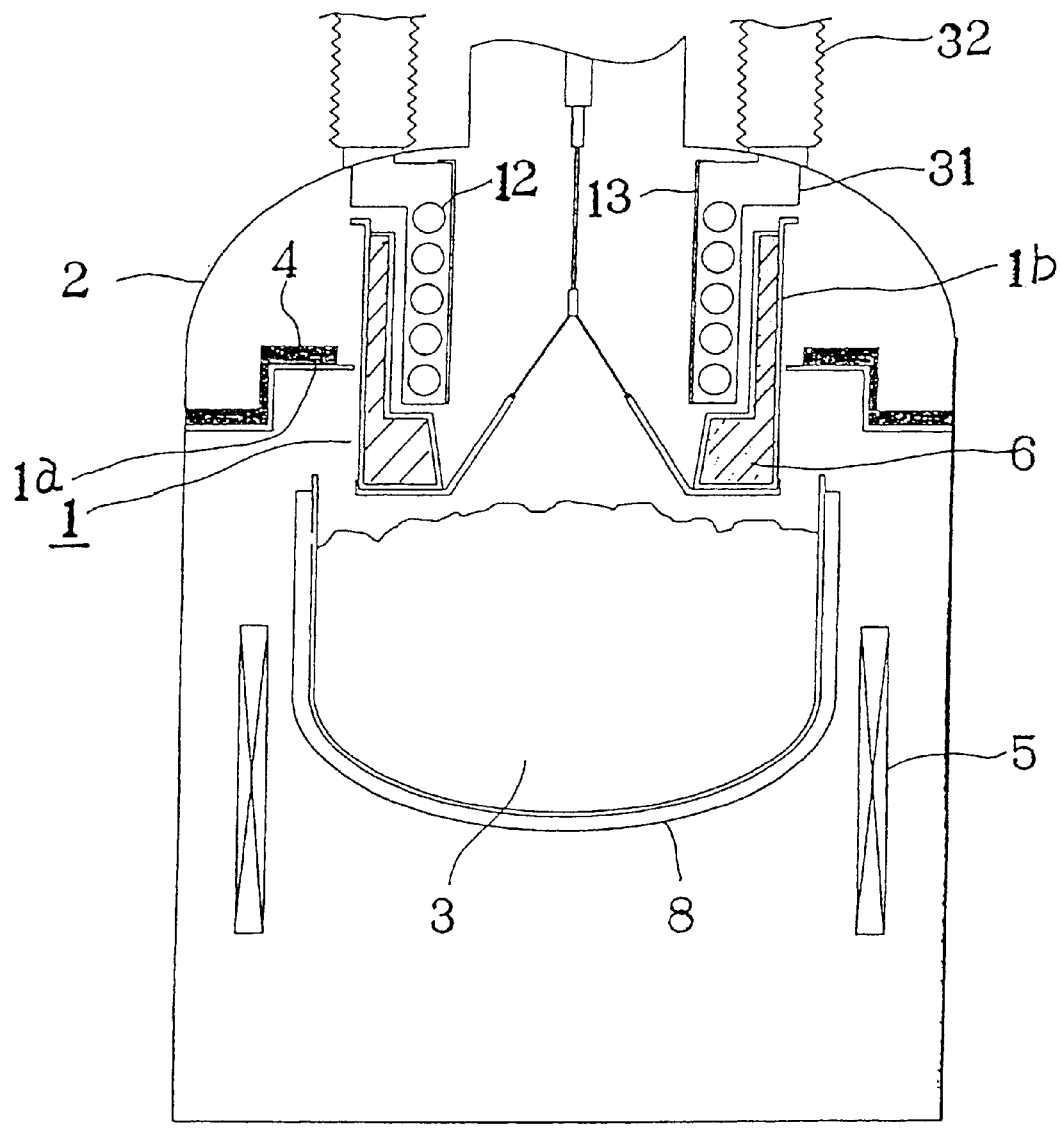
FIG. 6 is a schematic diagram showing the lower portion of the single-crystal manufacturing device according to the fourth embodiment of this invention.

FIG. 6 is a schematic diagram showing the lower portion of the single-crystal manufacturing device according to the fourth embodiment. In this single-crystal manufacturing device, an after-cooler 31 is installed inside the heat shield plate 1 in such a way that it can ascend or descend freely. The heat shield plate 1 is the same as that used in the first embodiment of the single-crystal manufacturing device shown in FIG. 1. A coil-shaped cooling water piping 12 is accommodated in the cylindrical portion of the after-cooler 31. The cylindrical portion surrounds the single crystal 7. The after-cooler 31 can ascend or descend along the central line of the single crystal 7 with the aid of an ascending/descending mechanism 32 installed outside the chamber 2. Furthermore, an adiabatic material 4 made of carbon fibers is installed on the top surface of the rim la of the heat shield plate 1. In this single-crystal manufacturing device, both the heat shield plate 1 and the after-cooler 31 can ascend or descend, therefore the heat shield plate 1 and the after-cooler 31 can be raised during the melting of the raw material. It is also possible to raise the crucible 8 so as to first melt the raw material located at the bottom of the crucible 8. Thus, it is satisfactory to keep the axial length of the heater 5 equal to those of conventional heaters.

The temperature gradient along the longitudinal axis of the single crystal increases in proportion to the amount of cooling water supplying to the after-cooler. The temperature gradient along the longitudinal axis of the single crystal also grows if the lower end of the after-cooler approaches the free surface of the melted liquid. In the fourth embodiment of the single-crystal manufacturing device, both the amount of cooling water supplied to the after-cooler 31 and the distance between the after-cooler 31 and the free surface of the melted liquid are controlled so as to obtain an expected temperature gradient along the longitudinal axis of the single crystal.

Figure 7:
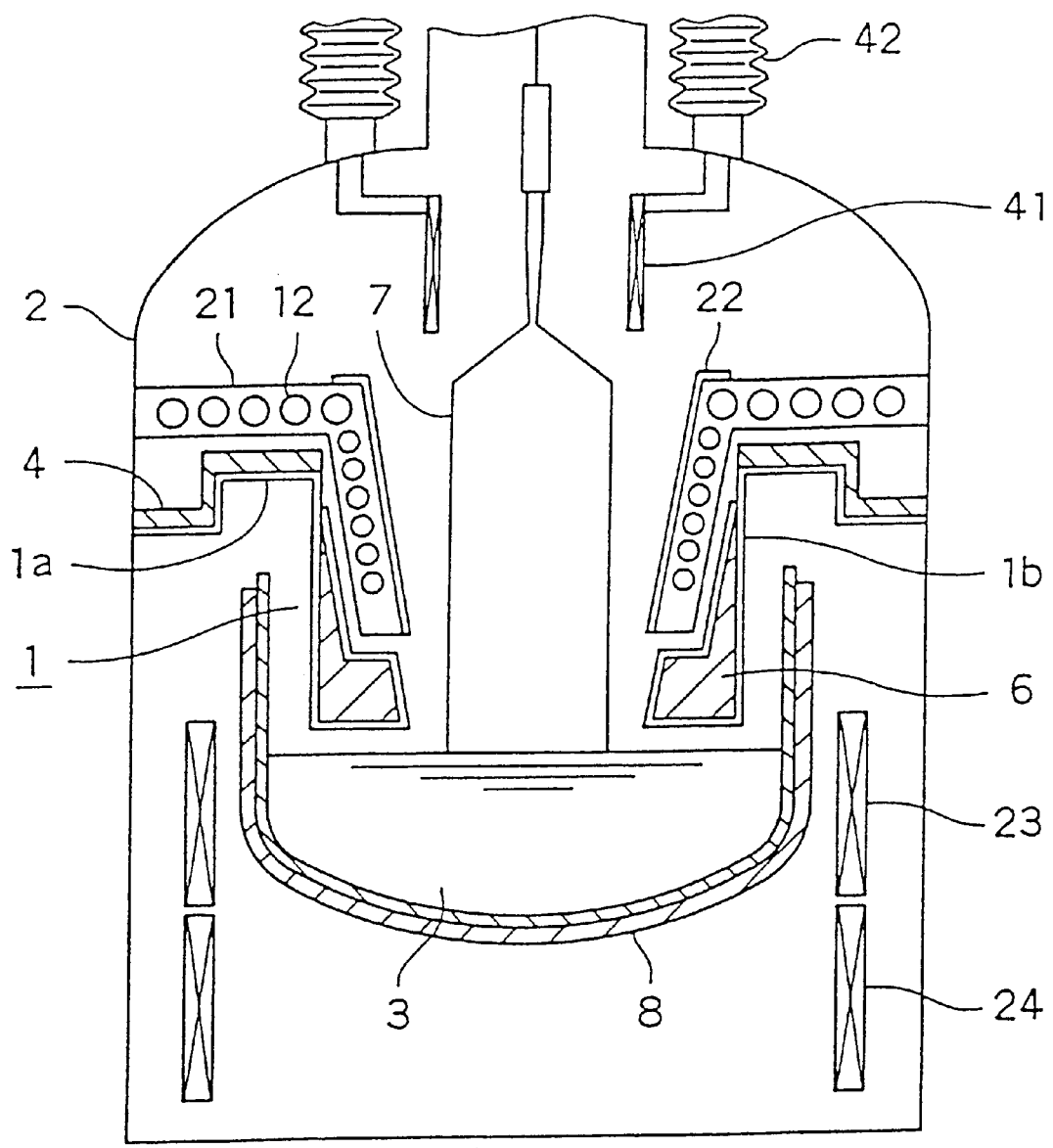
FIG. 7 is a schematic diagram showing the lower portion of the single-crystal manufacturing device according to the fifth embodiment of this invention.

FIG. 7 is a schematic diagram showing the lower portion of the single-crystal manufacturing device according to the fifth embodiment. The above single-crystal manufacturing device is that of the third embodiment shown in FIG. 5 with an after-heater installed therein. The heat-emission portion of the after-heater 41 is in the shape of a cylinder and can be directed to ascend or descend along the central line of the single crystal 7 with the aid of a ascending/descending mechanism 42 installed outside the chamber 2. The after-heater 41 possesses a function of controlling its output in response to the single-crystal length.

The after-heater 41 is raised to the upper portion of the chamber 2 during the melting of the raw material. After the raw material has been melted, the after-heater 41 is supplied with a preset power and is lowered. At the beginning of lifting the single crystal 7, the after-heater 41 is at the location closest to the free surface of the melted liquid 3. Then, the after-heater 41 is gradually raised until the single-crystal length reaches a value of 300–400 mm, at which point the raising of the after-heater 41 is stopped. Fundamentally, by installing the after-heater at the location at a temperature lower than the central temperature 600° C.–700° C. of the single crystal 7 by a value of 100° C.–300° C., the temperature gradient in the region at temperature 600° C.–700° C. can substantially be reduced.

Figure 8:
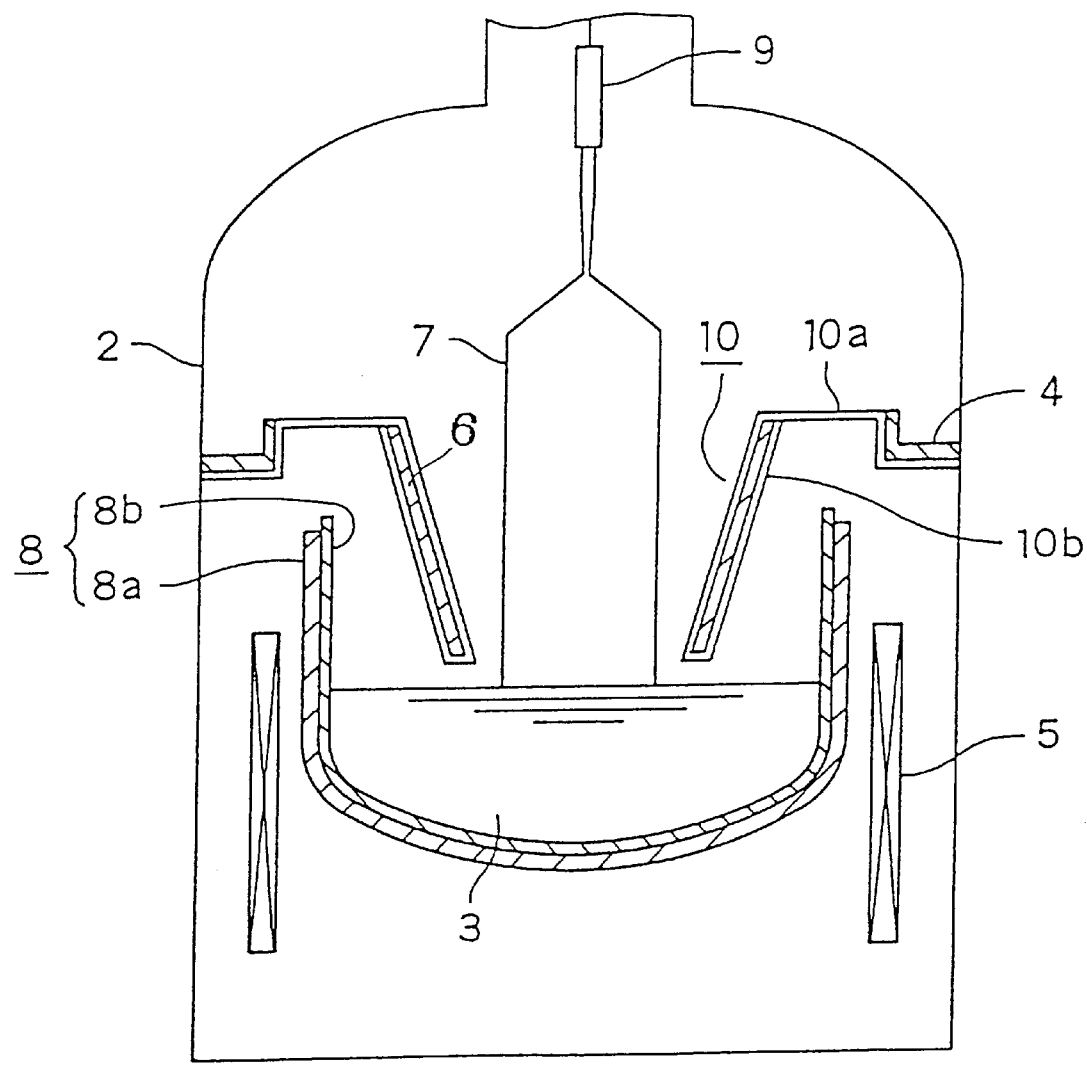
FIG. 8 is a schematic diagram showing the lower portion of a conventional single-crystal manufacturing device.

The single-crystal lifting speeds obtainable by employing the above-mentioned manufacturing devices and methods were investigated and the results are listed in Table 1, wherein the value of single-crystal lifting speed in the conventional manufacturing device shown in FIG. 8 was set to be 1.

TABLE 1

| Manufacturing Device | FIG. 1 | FIG. 2 | FIG. 5 | FIG. 6 | FIG. 7 | FIG. 8 |
|---|---|---|---|---|---|---|
| Lifting Speed | 1.1~1.4 | 1.3~2.5 | 1.3~2.2 | 1.1~2.2 | 1.3~2.2 | 1.0 |

In the first embodiment of the single-crystal manufacturing device shown in FIG. 1, the single crystal is cooled down only by the heat shield plate according to this invention. Compared with the conventional device, the single-crystal lifting speed can be multiplied by a value of 1.1–1.4. However, if the heat shield plate is used together with an after-cooler such as those shown in FIGS. 2, 5, 6 and 7 (the second embodiment to the fifth embodiment), the single-crystal lifting speeds can be multiplied by a value of 1.1–2.5.

In the single-crystal manufacturing device shown in FIGS. 2, 5 and 7, it is acceptable to use a combination of a ring-shaped after-cooler and a cylinder (or cylindrical cone) instead of a fixed-type after-cooler 11 or 21. The ring-shaped after-cooler covers the top surface of the heat shield plate 1, and the cylinder (or cylindrical cone) is made of high heat-transfer material and surrounds the single crystal 7. The fixed-type after-cooler covers the top and half of the inner surfaces of the heat shield plate 1.

As above-described, the temperature gradients of the single crystal in the region near the solid-liquid boundary can be increased by employing a heat shield plate provided with an enhanced adiabatic capacity to shield heat radiating from the region near the solid-liquid boundary, or by employing a combination of an after-cooler and an after-heater. Therefore, the single crystal can be lifted at a speed higher than that in a conventional device. Furthermore, the lifting speed of the single crystal is kept constant from the top to the bottom of the crystal, consequently the heat history throughout the entire length is invariant. Therefore, single crystals with uniform qualities along their axes can be obtained.

What is claimed is:

1. A single-crystal manufacturing device employing the CZ method, which comprises:

a heat shield plate consisting of a ring-shaped rim installed above the hot zone and an adiabatic cylinder extending downward from the inner edge of the rim and surrounding the single crystal being lifted, the thickness of the lower portion being from 2 to 6 times that of a conventional heat shield plate, the top portion of the heater being located below the connection line connecting the lower end of the heat shield plate and the intersection of the outer periphery of the single crystal being lifted and the free surface of the melted liquid, and an after-cooler covering the top surface of the rim of the heat shield plate and being disposed inside the adiabatic cylinder to encompass the single crystal being lifted.

2. A single-crystal manufacturing device as claimed in claim 1, wherein the after-cooler surrounding the single crystal being lifted is adapted to permit it to ascend and descend without any restraint.

3. A single-crystal manufacturing device employing the CZ method, which comprises a heat shield plate consisting of a ring-shaped rim installed above the hot zone and an adiabatic cylinder extending downward from the inner edge of the rim and surrounding the single crystal being lifted, the thickness of the lower portion being from 2 to 6 times that of a conventional heat shield plate, the top portion of the heater being located below the connection line connecting the lower end of the heat shield plate and the intersection of the outer periphery of the single crystal being lifted and the free surface of the melted liquid, and an after-cooler covering the top surface of the rim of the heat shield plate and being disposed inside the adiabatic cylinder to encompass the single crystal being lifted, the heater extending downwardly for a distance equal to the raised span of the crucible while melting the raw material and its heating center is shifted a distance equal to the raised span of the crucible while melting the raw material, or the heater extending downwardly for a distance equal to the raised span of the crucible while melting the raw material and is divided into two stages.

4. A single-crystal manufacturing device as claimed in claim 3, wherein the after-heater surrounding the single crystal being lifted is installed in a manner to permit it to ascend and descend without any restraint.

* * * * *